United States Patent [19]

Lincoln

[11] 3,893,158

[45] July 1, 1975

[54] LEAD FRAME FOR THE MANUFACTURE OF ELECTRIC DEVICES HAVING SEMICONDUCTOR CHIPS PLACED IN A FACE TO FACE RELATION

[75] Inventor: Milan L. Lincoln, Phoenix, Ariz.

[73] Assignee: Motorola, Inc., Chicago, Ill.

[22] Filed: Aug. 30, 1973

[21] Appl. No.: 393,180

Related U.S. Application Data

[63] Continuation-in-part of Ser. No. 234,955, March 15, 1972, abandoned.

[52] U.S. Cl. ........................ 357/70; 357/19; 357/68
[51] Int. Cl. ................................................ H01l 5/02
[58] Field of Search ...................... 357/68, 19, 29, 70

[56] References Cited

UNITED STATES PATENTS 3,727,064 4/1973 Bottini .................................. 357/68

*Primary Examiner*—Michael J. Lynch
*Assistant Examiner*—E. Wojciechowicz
*Attorney, Agent, or Firm*—Foorman L. Mueller

[57] ABSTRACT

A single lead frame which is utilized in the high speed mass production of a plurality of electrical devices, includes a plurality of integral frame segments each having first and second end joining bands and first and second side joining bars. Selected lead portions extend from the end joining bands and have offset areas adapted to each receive one of a set of electrical units such as semiconductor chips which are to be placed in a face-to-face relation. Other lead portions may be connected to the chips by fine interconnecting wires. After the side joining bars are severed from the first end joining band, the lead frame structure permits the second end joining band to be rotated 180° with respect to the first end joining band and the end portions of the side joining bars to be interlocked with shaped portions in the first end joining band to place the semiconductor chips in a facing relation. Next, transparent material may be inserted between the semiconductor chips and a protective body is molded around the chip, selected parts of the frame and the transparent material. Selective stamping then provides a completed device.

8 Claims, 11 Drawing Figures

PATENTED JUL 1 1975 3,893,158

SHEET 1

LEAD FRAME FOR THE MANUFACTURE OF ELECTRIC DEVICES HAVING SEMICONDUCTOR CHIPS PLACED IN A FACE TO FACE RELATION

RELATED INVENTIONS

This application is a continuation-in-part of copending application Ser. No. 234,955 now abandoned filed Mar. 15, 1972.

The present invention, which is assigned to Motorola, Inc. is related to other inventions and patents also assigned to such assignee including Doyle U.S. Pat. No. 3,367,025, issued Oct. 17, 1967; Bell and Doyle U.S. Pat. No. 3,531,856, issued Oct. 6, 1970; Helda and Lincoln U.S. Pat. Nos. 3,413,713, issued Dec. 3, 1968; and 3,444,441, issued May 13, 1969; and Segerson U.S. Pat. Nos. 3,560,808, issued Feb. 2, 1971; and 3,611,061, issued Oct. 5, 1971.

BACKGROUND OF THE INVENTION

Some electrical devices include semiconductor chips or other cooperating components which must be juxtapositioned in a face-to-face relationship to each other to facilitate operation thereof. More particularly, devices are being fabricated which each include a photodiode chip, which may have a light emitting surface made from gallium arsenide, and a silicon controlled rectifier (SCR) or transistor chip having a light responsive surface. A translucent or transparent material is inserted between the two foregoing surfaces of the device which conducts light at frequencies emitted by the diode. Also included in the devices are a plurality of leads and interconnecting wires for making electrical and mechanical connection to the chips. An encapsulating material, such as plastic, is molded around the chips, light-conductive material, interconnecting wires and interior portions of the leads to provide a compact, rugged and light weight product.

In operation, the light emitting diode responds to an electrical control signal to produce light which is transmitted by the light conductive material to change the electrical characteristics of the SCR or transistor. Hence, the package must hold the cooperating die in fixed relation to each other in addition to providing protection for the chips against mechanical stresses and contamination. Other electrical devices utilizing light emitting and light responsive semiconductor chips which must be juxtapositioned in a facing relation are also being fabricated.

In the past, mass production techniques for automated manufacture of these devices have usually required the employment of at least two separate elongated metal lead frame strips to make a complete device. Each of these prior art strips must be punched, stamped or etched from a suitable material such as nickel, and then gold plated to facilitate die and wire bonding. Next, semiconductor chips of a first kind, such as light emitting diodes are bonded to mounting areas provided on the first frame and chips of the second kind, such as photo transistors, are bonded to mounting areas on the second frame. Then, fine interconnecting wires are connected from bonding pads on the chips to the ends of the interior portions of the lead members of each of the two frames. Next, portions of each of the first and second prior art lead frames usually must be trimmed away so that both frames can be simultaneously held in a spaced relationship with respect to each other by a fixture to juxtaposition the die in a facing relationship. After light conducting material is placed between the chips, plastic encapsulation is performed. Finally, the leads are separated from the lead frames by shearing, and the leads are next formed to have a desired orientation with respect to each other and the plastic housing.

Many problems and disadvantages are associated with the foregoing prior art processes of manufacture which tend to undesirably decrease the yield and increase the price of the resulting devices. For instance, since two lead frames are required to make a finished product, excessive expenses are accumulated during stamping, plating and shipping operations. Moreover, a significant portion of each of the gold plated, nickel lead frames are discarded during the prior art manufacturing process. Problems also result from the accumulation of manufacturing tolerances which sometimes make it impracticable for the holding fixtures to orient the individual semiconductor chips of each pair in the critical spaced relationship required for light communication therebetween. Finally, some prior art manufacturing techniques require one lead frame to be superimposed over the other lead frame during the plastic encapsulation process. This usually results in two thicknesses of lead frame material being placed between the closing portions of the transfer mold which increases the complexity of the mold and makes sealing more difficult. Also, the punches utilized in the final trim out stages must punch through two thicknesses of lead frame material thereby increasing the probability of creating burrs on the leads and improper separation which may cause the leads to be pulled from the plastic encapsulating body.

SUMMARY OF THE INVENTION

An object of this invention is to provide an improved lead frame structure and process which is useful in the high speed mass production of electrical devices including components which must be juxtapositioned in a facing relation to each other.

Another object is to provide a single lead frame used in the fabrication of a molded encapsulated electrical device which includes a set of semiconductor chips positioned in a fixed relation next to each other in substantially parallel planes and which requires only a single thickness of material to be placed between the closing portions of the mold for the molding portion, and only a single thickness to be cut by the trim-out dies.

Still another object is to provide a manufacturing process employing a lead frame having a configuration which enables semiconductor chips of a first kind to be mounted on first portions thereof and semiconductor chips of a second kind to be mounted on second portions thereof, and which facilitates separation of the first and second portions and enables one of them to be rotated with respect to the other, and then interlocked in the changed position to place the first and second semiconductor chips in predetermined spatial relations to each other.

A further object is to provide a process of manufacture and a lead frame which facilitates economical, high yield production of plastic encapsulated electrical devices including cooperating light emitting and light responsive components.

In brief, an elongated metal strip is provided which includes a plurality of integral lead frame portions for use in a high speed fabrication process for a plurality of electrical devices each of which includes a set of semiconductor chips or other units which must be juxtapositioned in a desired relationship to each other. One of each of the chips may be a light emitting diode and another may be a light responsive semiconductor component. In other words, for each pair of semiconductor units, one is light emitting and the other is light detecting. These chips are ultimately encased in an encapsulating housing which is molded to surround portions of the lead frame which are either electrically or mechanically attached to the chips. First and second end joining bands with first and second joining bars connected therebetween form outlining portions of each of the frame segments. First and second sets of metal fingers, which ultimately become leads, extend in a direction away from each end joining band toward the center of each frame. At least one finger of each set has a mounting area thereon for receiving a die or chip. Fine wires connect the ends of the other fingers to such die or chip. One of the end joining bands includes a first interconnecting structure which may be comprised of selectively shaped apertures evenly spaced therein. Moreover, each of the ends of the side joining bars includes a second interconnecting structure which may be comprised of a portion that is selectively shaped to interlock with the apertures. The side joining bars are severed from an end joining band and one of the first and second end joining bands is rotated 180° with respect to the other. The configuration of the lead frame portions provides that the chips or other units are juxtapositioned in the desired spatial relation, in response to the interconnecting structures being placed in mating interlocked engagement. The interlocked structure holds the chips in place. If desired, transparent material is next inserted between the chips. Then plastic can be molded around the chips, transparent material, interconnecting wires and the interior portions of the leads. Finally, the exterior lead portions are separated from the frame and bent to desired positions.

DETAILED DESCRIPTION

This invention relates to a lead frame and process facilitating the manufacture of electrical devices each including at least a pair of components, such as semiconductor die or chip, which must be juxtapositioned in a facing relation. Such devices may be comprised of a semiconductor chip of a first kind, such as a light emitting diode, and a semiconductor chip of a second kind, such as a light responsive transistor or light responsive silicon controlled rectifier (SCR). To facilitate operation, the transistor or SCR must be positioned within the device to receive light emitted from the diode so that an electrical characteristic of the SCR or transistor, such as its resistance, is selectively controlled by energization of the diode. Ultimately, each pair of semiconductor chips along with associated interior lead portions, interconnecting wires and transparent material forming a light conductive path between the chips, are encased in an encapsulating housing that is molded around portions of the lead frame while such portions are still a part of an integral, metal strip. Such devices are adapted to be assembled and encapsulated mostly by automated equipment.

Figure 1:
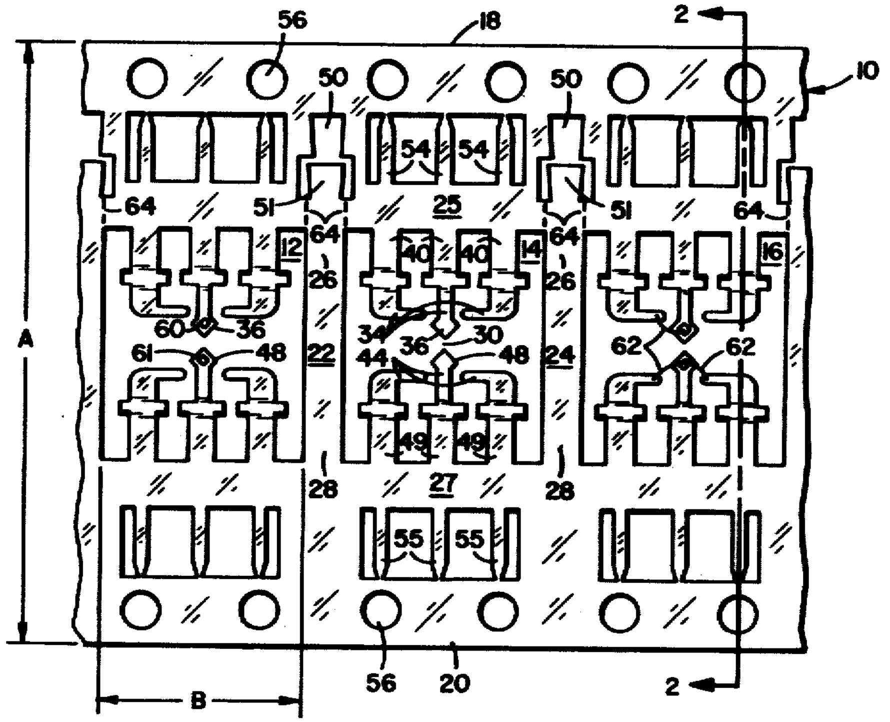
FIG. 1 is an enlarged plan view of three segments of an elongated stamped metal lead frame including a plurality of other corresponding segments.

Referring now to FIG. 1, an enlarged lead frame portion 10 which includes segments 12, 14 and 16 is illustrated as being broken out of an elongated metallic strip which includes a plurality of additional segments which are substantially identical to those shown. The dimension A in FIG. 1 is on the order of 0.9 inch and the dimension B is on the order of 0.35 inch. Other dimensions, if desired, can be obtained by scaling with respect to dimensions A and B. It is a miniature device when completed from the lead frame. The metallic strip of the lead frame may be fabricated from an electrical current and heat conductive metal that is relatively soft and corrosion resistant, such as nickel, by a series of metal stamping steps. Chemical etching and mechanical machining are also suitable for fabricating lead frame 10.

Each segment of lead frame 10 is comprised of a plurality of integral portions. For instance, segment 14 includes and is defined by portions of first end joining band 18, second end joining band 20 and side joining bars 22 and 24. A first lead spacing member 25, which runs parallel to the first and second and joining bands connects first ends 26 of each of the side joining bars to first end joining band 18. Similarly, second lead spacing member 27 connects second ends 28 of each of the side joining bars to second end joining band 20.

The side joining bars 22 and 24 run parallel to each other between the first and second end joining bands to define frame segments each of which encloses an area having a central portion 30. End joining bands 18 and 20 and lead spacing members 25 and 27 each extend the entire length of lead frame 10 and increase the structural strength thereof.

In the parlance of the art, the portions 18 and 20 are sometimes called indexing rails, and the portions 22 and 24 are called interlocking ribs or rib supports. The portions 25 and 27 are also called interconnect or tie bar portions of the lead frame.

A first set of selectively shaped metal fingers, which ultimately become interior lead parts, have first end portions 34 extending generally toward central part 30 of the area enclosed by the frame segment. At least one of first end portions 34 has a first mounting area 36 attached thereto for supporting a semiconductor chip of the first kind, e.g., a light emitting semiconductor such as gallium arsenide. First lead spacing member 25 connects the second end portions 40 of the first set of shaped metal pieces to first end joining band 18.

A second set of selectively shaped metal fingers which also ultimately become interior lead parts, have first end portions 44 extending generally toward the central part 30 of the area enclosed by the frame segment. Moreover, at least a first one of end portions 44 has a second mounting area 48 integrally connected therewith on which a semiconductor chip of the second kind, e.g., a photo transistor or light detecting semiconductor, can be mounted. Second lead spacing member 27 connects second end portions 49 to second end joining band 20.

First end joining band 18 has a plurality of first interconnecting members provided therein which are illustrated as selectively shaped apertures 50, opening in a direction toward second end joining band 20. Second interconnecting members 51 which are adapted to fit in mating engagement with apertures 50 are integrally connected to first end portions 26 of side joining bars 22 and 24. First exterior lead portions 54 extend from first lead spacing member 25 toward first joining band 18 and second exterior lead portions 55 extend from said second lead spacing member 27 toward second joining band 20. An indexing array in the form of the openings 56 is provided in the original strip of metal for aligning the lead frame with manufacturing machines during each of the steps of device fabrication.

Figure 2:
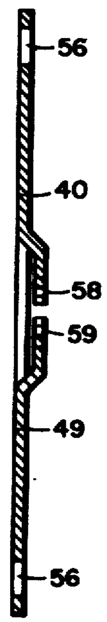
FIG. 2 is a section view of an end most segment of the lead frame of FIG. 1 showing the offset ends of interior lead portions.

As shown in FIG. 2, which is a cross-sectional view along lines 2—2 of segment 16 of FIG. 1, interior end subportions 58 and 59 of first and second sets of leads are formed or offset to lie in a plane which is parallel to the plane of the frame. This may be done after or during the stamping process which transforms a longitudinal metal strip into a lead frame having the configuration shown in FIG. 1. Next, a thin gold layer is placed on all surfaces of lead frame 10 to facilitate die and wire bonding.

Referring to segment 12 of FIG. 1, a minute, fragile silicon chip 60, which includes a semiconductor device of the first kind, is shown affixed on first mounting area 36. Also a minute, fragile semiconductor chip 61, which includes a semiconductor device of the second kind, is shown on second mounting area 48. To mount chips 60 and 61, lead frame 10 is placed on a conveyor with projections that cooperate with indexing array 56. The conveyor is programmed to position first mounting areas 36 at a predetermined location in a die bonder. Next, each of the chips 60 is carefully oriented so that the die bonder may grasp it and automatically attach it to first a mounting area 36. Then, lead frame 10 is again run through the die bonder to attach each of the chips 61 to a second mounting area 48. Each of the chips may have a terminal on its bonded surface which is electrically connected to its mounting area by the die bonding process.

Indexing array 56 is also utilized to position lead frame 10 in a wire bonder which connects fine gold wires 62, shown in segment 16 of FIG. 1. These wires electrically interconnect bonding pads or electrodes on the die surface to the leads by thermal compression welding.

Figure 3:
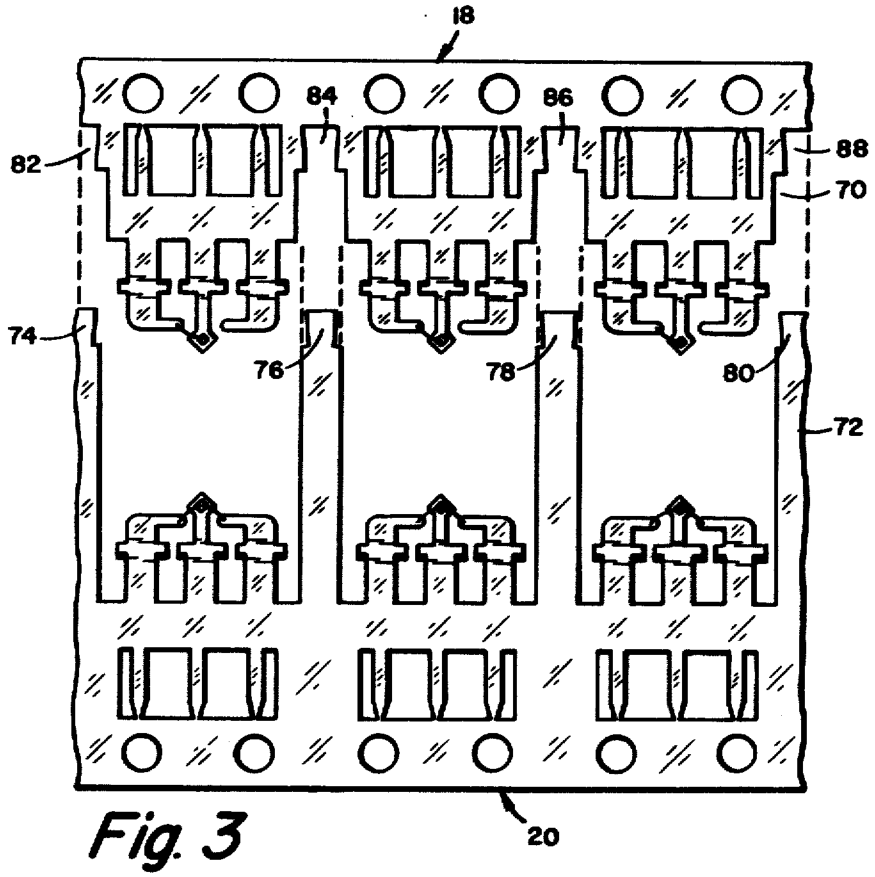
FIG. 3 is another enlarged plan view of the lead frame of FIG. 1 illustrating the separation of the first and second end joining bands after the side joining bars have been severed from the first end joining band.
Figure 3A:
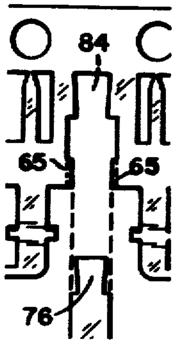
FIG. 3A is a fragmentary detail from FIG. 3 showing the actual configuration after a tiny slug of metal has been removed on each side of a side joining bar as it is separated from the end joining band.

After die and lead bonding have been performed first lead spacing member 25 is sheared along dotted lines 64 of FIG. 1 so that lead frame 10 can be separated into two portions 70 and 72 as shown in FIG. 3. Since this initial trim-out operation involves separating the side joining bars at points which do not have a critical shape, it can be performed by relatively inexpensive stamping machinery whereas the more critical stamping utilized to make lead frame 10 is usually performed by a vendor. In the trimout operation a tiny slug of metal 65 as shown in FIG. 3A is removed from the lead spacing member 25 on each side of the dotted lines 64. This is merely shown for the one segment out of FIG. 3, but there is the same removal at each side joining bar as the two halves of the lead frame are separated in the trim-out cutting.

Figures 4, 6:
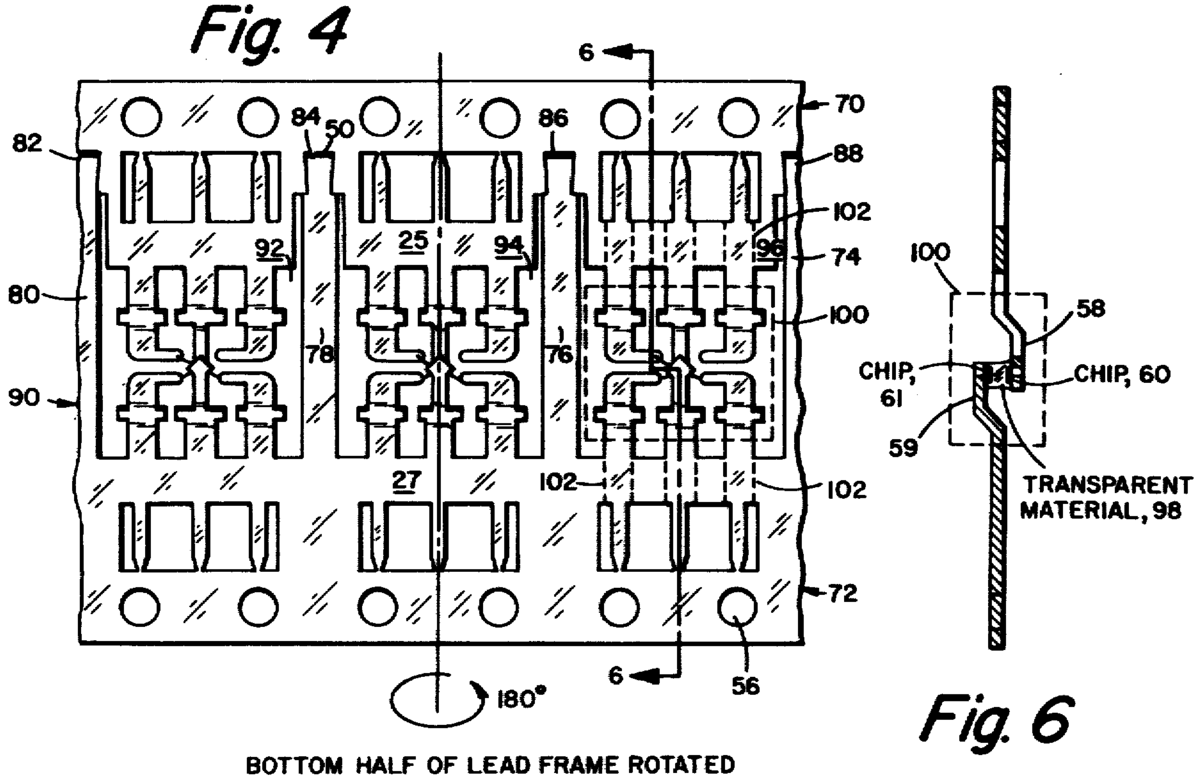
FIG. 4 is an enlarged plan view of a lead frame formed by rotating the second end joining band of FIG. 3 180° with respect to the first end joining band and interlocking the selectively shaped ends of the side joining bars with similarly shaped apertures in the first end joining band.
FIG. 6 is an end section view of the end most segment of FIG. 4 which illustrates the end relation between the leads, semiconductor chips, transparent material and an encapsulating body.

Next, the bottom half 72 of lead frame 10 is rotated 180° with respect to top half portion 70, as illustrated in FIG. 4. Although this step is illustrated with the bottom half rotated, this can be accomplished by rotating either of the two portions with respect to the other.

Next, the selectively shaped interconnecting portions 51 of the side joining bars are interlocked with the selectively shaped interconnecting apertures 50 provided in first end joining band 18. This results in pairs of first and second kinds of semiconductor devices being juxtapositioned in a face-to-face relationship with respect to each other. The combination of structural elements including the end joining bands, side joining bars and lead spacers give the resulting lead frame sufficient rigidity and strength so that portions 70 and 72 remain interlocked during handling.

Figures 5, 7:
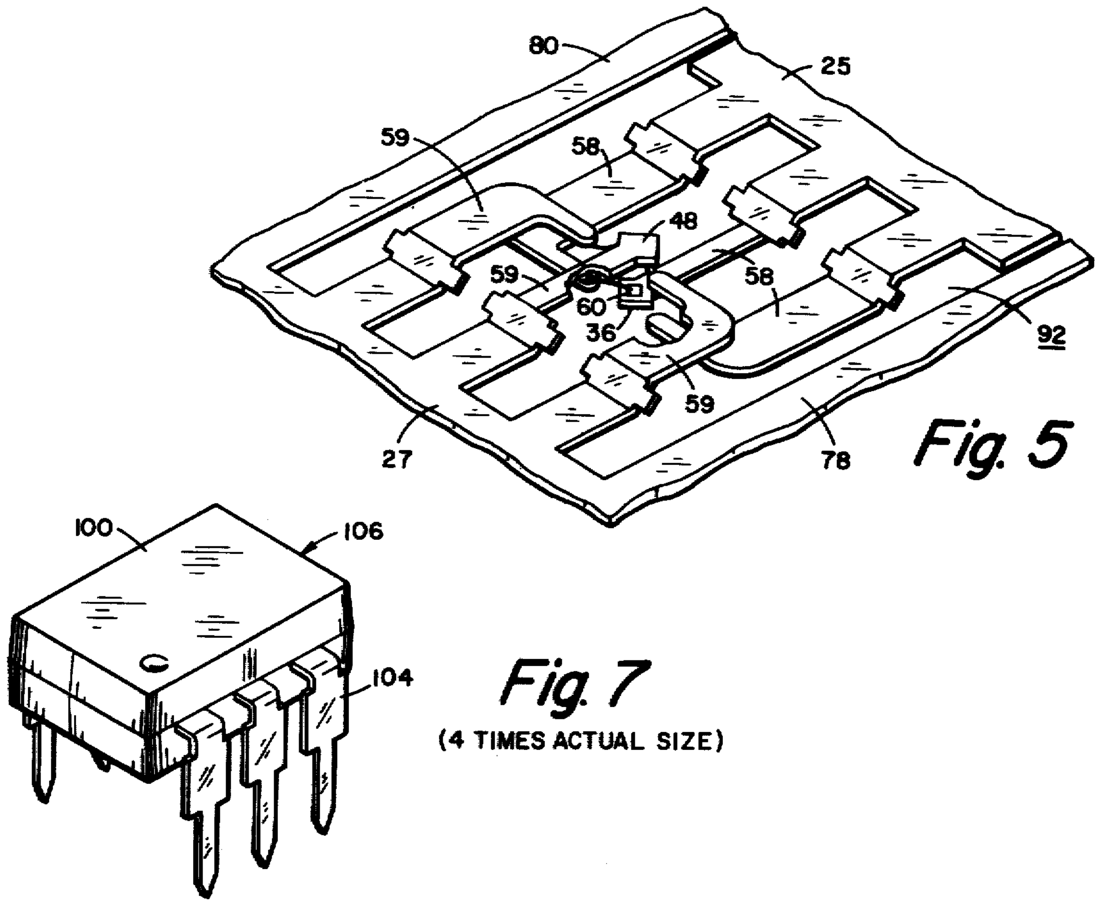
FIG. 5 is a further enlarged fragmentary, isometric view of a portion of a segment of the lead frame of FIG. 4 which shows the topographical relationship between portions of the leads thereof.
FIG. 7 is an enlarged isometric view showing the shape of a completed semiconductor device of the kind assembled on the segments shown in FIG. 4.

The interlocking to position the two portions of the lead frame as shown in FIG. 4 is accomplished by the operator who takes the bottom half in hand, and projecting the interconnecting portions 51 on the bars, as bar 76 in FIGS. 3 and 3A, for instance, toward the interconnecting apertures, and seats such key positions at the corresponding apertures. The portion 51 in FIG. 1 and 86 in FIG. 4, together with the receiving portions 50 are initially formed to very close tolerances. Then that half of the lead frame is lowered toward the other half with the chips opposite to one another as shown in FIG. 5. This protects the connecting wires and chips against injury as they are brought into juxtaposition. The interlocking portions are pressed together and fully engaged as shown in FIG. 4, and are in a tight frictional fit to provide self-jigging and hold the two sections together as they are handled during the steps through encapsulation, when the parts are all fixed relative to one another.

More specifically, referring again to FIG. 3, side joining bars 74, 76, 78 and 80 extend generally perpendicular to and away from second end joining band 20. Interconnecting apertures 82, 84, 86 and 88, which are provided in the first end joining band 18, respectively open toward bars 74, 76, 78 and 80. After portion 72 is rotated with respect to portion 70, as shown in FIG. 4, the right-most side joining bar 80 is interlocked with the left-most aperture 82 and left-most side joining bar 74 is interlocked with right-most aperture 88 to form lead frame 90 having segments 92, 94 and 96. As previously mentioned, lead frame 10 usually includes more than three segments; however, the principle illustrated in FIG. 3 and FIG. 4 can be expanded to apply to a lead frame having any practicable number of segments. Although the interconnecting structures are illustrated as being of a "dovetail " shape, other interlocking configurations can easily be envisioned by those skilled in the art. Moreover, it is not essential that the first interconnecting structures be attached to the end joining bands and the side joining bars. A similar result could be provided, for instance, by extending side joining bars from both the first and second end joining bands and providing these bars with interconnecting portions at their ends. Furthermore, the interlocking structure here illustrated and described can be accomplished with the key and aperture provided in the lower half of the lead frame as such frame is shown in FIG. 1.

FIG. 5 illustrates a still more enlarged plan section view of a fragmentary portion taken from segment 92 of lead frame 90 which shows that the offset subportions 58 of the second set of leads lie in a first plane. The semiconductor device 61 of one kind is located on the hidden surface of mounting area portion 48 so that it faces semiconductor device 60 of the other kind. Side joining bars 78 and 80, first lead spacing member 25 and second lead spacing member 27 lie in a second plane parallel to the plane of offset portions 58. Second offset interior lead portions 59 lie in a third plane which is parallel to the first and second planes. A part of right-most lead portion 59 of FIG. 5 is shown as broken away to reveal the end of right-most lead portion 58. Therefore, the positioning of lead frame portions 70 and 72 of FIG. 4 ultimately result in the juxtapositioning of each pair of first and second semiconductor chips in the desired face-to-face relation, as shown in FIG. 5.

This useful result has been accomplished through the employment of a single lead frame 10 which can be separated and recombined to form lead frame 90 rather than by the employment of a plurality of lead frames as required by most prior art methods. It is also emphasized that lead frame 10 includes first and second interconnecting structures which enable lead frame portions 70 and 72 to be self jigging to form lead frame 90 of FIG. 4, maintained against separation in a first plane for the lead portions, and to hold die 60 and 61 in a spaced face-to-face relation to each other, in two planes each spaced away from one another and from said first plane. The structure of this invention also reduced the complexity and cost formerly represented in fixtures used to hold prior art lead frames and die in a spaced relation to each other.

Referring now to FIG. 6, light transmission from each light emitting device, such as chip 60, to each light receiving device, such as chip 61, is enabled by placing. transparent material 98 therebetween. In some applications, the incapsulating material may provide the desired frequency passband and thus perform the light conducting function even though it is opaque to frequencies within the visible spectrum. In other applications requiring transmission of other light frequencies a transparent substance 98 such as Dow Corning, clear junction coating (DCR-90-709) must be inserted between the cooperating die by known techniques before encapsulation.

Lead frame 90, of FIG. 4, which is partially assembled as described above, is next positioned in a transfer mold (not shown) in preparation for encapsulation in plastic. Indexing array 56 cooperates with a corresponding array on the face of the mold to align lead frame 90 and the mold. The upper and lower mold faces close on side joining bars, i.e., 74, 76, 78 and 80, and first and second lead spacing members 25 and 27 with sufficient force to seal the mold. To form an effective encapsulation a phenolic plastic at a low viscosity and high pressure is forced into each mold cavity which contains a semiconductor pair and related parts. Of the many well known plastic materials, thermal setting phenolic, or silicon base compound is preferred.

In FIG. 4, a plastic body 100 is indicated by dashed lines surrounding the interior lead portions, semiconductor chips, transparent material and interconnecting wires associated with segment 96 of frame 90. This plastic body is dense, rugged and effectively sealed to protect semiconductor chips 60 and 61 from contamination and physical stresses. The relationship between offset interior lead sub-portions 58 and 59, chips 60 and 61, transparent material 98 and plastic body 100 are illustrated by the section view taken along lines 6—6 of segment 96 which is shown in FIG. 6.

After encapsulation, selected portions of first lead spacing member 25 and of second lead spacing member 27 are severed during a final trim-out process to form the exterior lead portions and to separate body 100 and its leads from lead frame 90. For example, by shearing along dashed lines 102 of FIG. 4, which are associated with segment 96, the complete electric device encapsulated by body 100 and the leads therefor are separated from lead frame 90.

The separated external leads 104, as shown in FIG. 7, may be bent down at 90° angles from their original plane to aid the insertion of completed semiconductor device 106 into a socket. Moreover, completed electrical device 106, shown at approximately four times its actual size in FIG. 7 is of a size and configuration which makes it suitable for connection in electronic systems. Exterior lead portions 104, extending from the plastic body of device 106, are arranged in two parallel rows, with one parallel row on each of two sides of the body. Each row corresponds to one set of the metal fingers extending toward the center portion 30 of lead frame 10. Plastic housing 100 serves to maintain the metallic parts within device 106 in fixed positions so that the semiconductor dice or chips therein can operate in a cooperating manner.

It is further emphasized that lead frame 90 of FIG. 4 requires that only one thickness of lead frame material be placed in the mold during encapsulation and also provides a flat surface on which the mold can close. This surface is comprised of portions of the end joining bars and lead spacing members. These two features of lead frame 90 are advantageous with respect to prior art lead frames requiring either two thicknesses of frame metal in the mold or which provide an irregular mold closing surface thereby making it difficult for the mold to maintain a seal while plastic is being forced therein under pressure. Furthermore, lead frame 90 also provides only one thickness of material to be severed during the final trim-out operation which is an advantage with respect to some prior art lead frame configurations requiring two thicknesses of material to be simultaneously trimmed, which sometimes results in leads being pulled from the plastic body, and excessive wear on the cutting die.

Figure 8:
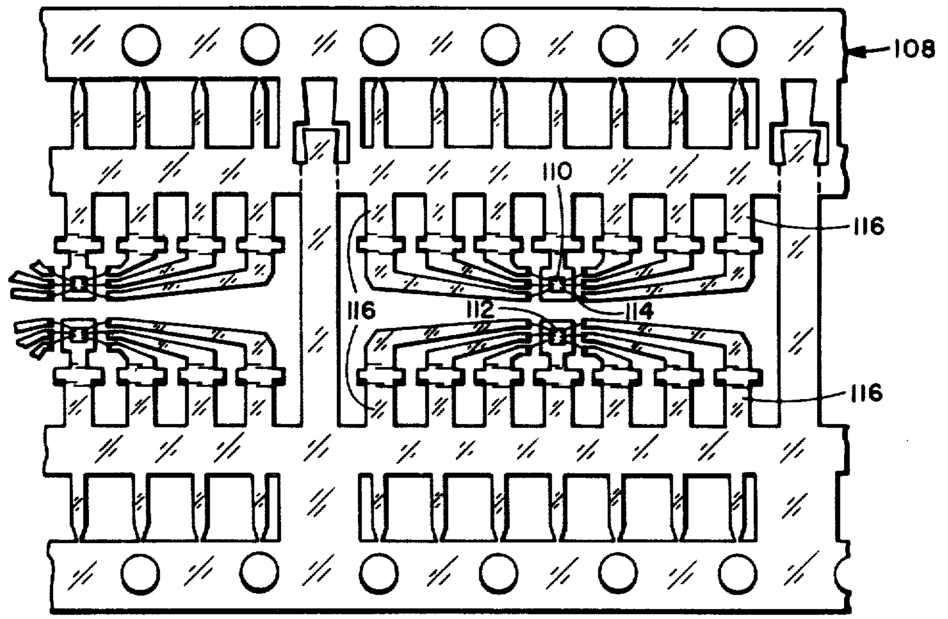
FIG. 8 is an enlarged plan view of one segment of a lead frame which includes a plurality of other corresponding segments and which facilitates a plurality of connections to each semiconductor chip.

Although the process of manufacture and the lead frame structure of the invention has been described with respect to an electrical device including a pair of semiconductor chips and six leads other embodiments of the invention are useful in other applications. More specifically, FIG. 8 is an enlarged plan view of alternative lead frame structure 108. Semiconductor chips 110 and 112 are mounted on mounting areas of the lead frame. The chips each include a plurality of bonding pads (not shown) each of which is connected by a fine wire 114 to an end portion of each of the plurality of leads 116. Hence, lead frame 108 facilitates the electrical connection of more than three leads to each semiconductor chip.

Figure 9:
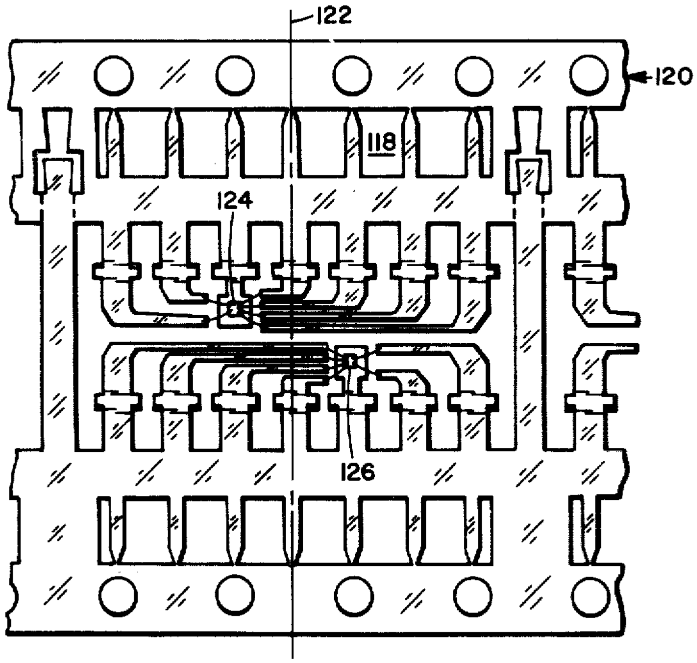
FIG. 9 is an enlarged plan view of one of many segments of a lead frame wherein the mounting areas for the chips are equal distances on each side of a center line running laterally across the segment.

FIG. 9 is an enlarged plan view of one of many segments 118 of lead frame 120.

Segment 118 has a center line 122. Chips 124 and 126 are located at equal distances on each side of the center line. After the lower portion of lead frame 120 is severed from the upper portion and one of the two portions is rotated 180 degrees with respect to the other and interlocked, chip 126 will be placed in a face-to-face relationship with respect to chip 124.

Figure 10:
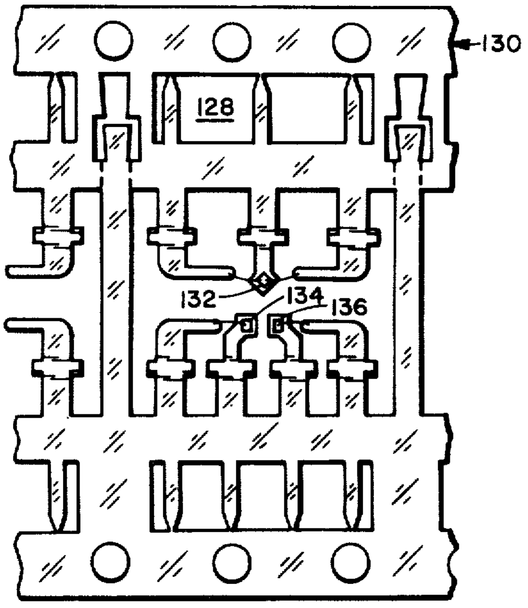
FIG. 10 is an enlarged plan view of a segment of an elongated stamped metal lead frame for facilitating the assembly of devices each having a plurality of cooperating semiconductor chips.

FIG. 10 is an enlarged plan view of segment 128 of lead frame 130. Lead frame 130 includes mounting areas for chips 132, 134, and 136. The lead frame 130 is arranged such that when the lower portion thereof is severed from the upper portion and rotated and interlocked, chip 132 is placed in an approximately face-to-face relationship with respect to chips 134 and 136.

What has been described, therefore, is an improved lead frame and a process of manufacture which are adapted to be utilized in the manufacture of electrical devices including components which must be juxtapositioned in a facing relation to each other. The lead frame enables semiconductor chips of a first kind to be mounted on a first portion thereof and semiconductor chips of a second kind to be mounted on a second portion thereof, and facilitates the separation of the first and second portions so that one can be rotated with respect to the other and interlocked to place the first and second semiconductor chips in the desired spatial relation. Moreover, the resulting interlocked frame provides a flat, single thickness of material to the mold and to the final trim-out die which simplifies their constructions. Finally, since only one lead frame is required to make a plurality of devices, the quantity of expensive lead frame material reduced to scrap is substantially reduced as compared to prior art manufactures requiring a plurality of lead frames in order to provide the face-to-face relationship for light detecting and light emitting semiconductor chips, or other electrical units.

I claim:

1. A one-piece metal lead frame for use in the multi-step fabrication of a plurality of electrical devices having two integral parts extending longitudinally of the length of said lead frame, with one part being severable from the other part of the lead frame in one step of said fabrication and adapted to be assembled in an interlocked relationship in another step of said fabrication with mounting pads in one part in a face-to-face relationship with mounting pads of the other part, said lead frame having a plurality of segments corresponding to the plurality of electrical devices to be fabricated positioned side by side over the longitudinal length of the lead frame and each extending transversely of said longitudinal length, each segment having two lead frame sections with one section being in one of said parts and the other section being in the other of said parts, and each said section having a mounting pad therein, metal portions in said lead frame extending transversely of said longitudinal length with two metal portions defining the longitudinal width of a segment, each said metal portion having therein a preformed locking aperture and a free-end locking projection of the same configuration as said aperture, with said aperture and said projections being separated upon severance of said one part from the other part of said lead frame, and with one said projection adapted to fit in one aperture upon the assembly of said two severed parts and maintained therein in a frictional fit and in a single plane to interlock said two parts together, with pairs of mounting pads in a face-to-face relationship in said interlocked position and with each mounting pad in a pair in a plane displaced from the plane of said other mounting pad of said pair.

2. A one-piece metal lead frame for use in the high speed multi-step fabrication of a plurality of electrical devices which includes the step of plastic encapsulating each said device, each of such devices including a pair of semiconductor means within the plastic encapsulation in a face-to-face relationship with one another, said one-piece metal lead frame including a plurality of segments extending side by side over the longitudinal length of said lead frame and corresponding in number to the number of devices to be fabricated therefrom, each segment comprising two sections integrally joined and positioned transversely of the longitudinal direction of the lead frame and each section having a semiconductor means mounting pad therein, a plurality of metal portions extending transversely of the longitudinal direction of the lead frame, each such portion having a preformed aperture of a predetermined configuration adapted to serve as a locking aperture and having a free-end projection pointing toward said aperture and of a configuration and size such that it will frictionally fit into said aperture, said one-piece metal lead frame adapted to be severed longitudinally thereof into two parts such that one section of said two sections of a segment is in each part, with one severed part adapted to be rotated 180° relative to said other part and with the mounting pads thereof brought into face-to-face relationship with one another, and with said apertures of said portions adapted to receive said projections of said portions in a frictional fit to assemble and interlock said two parts together in a single plane at the interlocks and with said mounting pads being in two displaced planes.

3. A one-piece metal lead frame for use in the high speed multi-step fabrication of a plurality of plastic encapsulated electrical devices having a plurality of segments over the longitudinal length thereof and each extending transversely of said longitudinal length, each segment having two sections therein and each section having a semiconductor means mounting pad therewith, with the mounting pad in a plane displaced from the plane of the remainder of the section, said one-piece metal lead frame adapted to be severed in one fabricating step which severs one longitudinal part from another longitudinal part of the lead frame, with each said part having a plurality of said segment sections therein, and with one part of said lead frame after separation being rotatable 180° relative to the other part to position the mounting pads in one part in face-to-face relationship with the mounting pads of the other part, a plurality of metal portions in the lead frame extending transversely thereof, each said metal portion having therein a preformed aperture of a predetermined configuration and a preformed free-end projection spaced from said aperture and of a configuration to fit into said aperture for an interlocking function, said apertures and free-end projections being separated upon the severance of said lead frame into two parts and said two parts being adapted to be assembled together with each aperture and projection in a frictional fit for maintaining said two parts together for the continued fabrication of the plurality of devices with the lead frame.

4. A metal lead frame for use in the fabrication of a plurality of electrical devices in one piece with the major area thereof in a single plane, said lead frame having two integral parts each extending longitudinally of the length of said lead frame, with one part adapted to be severed from the other part and rotated 180° relative to the other part and assembled together, said lead frame having a plurality of segments side by side and longitudinally thereof with each segment having two sections which together extend transversely in the lead frame, an integral mounting pad in each section displaced from the single plane of the major area of the lead frame adapted to have a semiconductor means mounted thereon, with two semiconductor means for respective sections being in face-to-face relationship upon said 180° rotation, means in said one-piece lead frame to interlock together the two rotated parts when semiconductor means are in said face-to-face relationship for each ultimate electrical device, with said interlock means including a plurality of metal portions in the lead frame defining the sides of each two-section segment thereof, and each said metal portion having therein a preformed locking aperture and a preformed free end projection, with projections and apertures being separated upon said severance and a single projection adapted to be pressed into a single aperture with a frictional fit upon said assembly of said two parts to maintain said two parts together for a subsequent fabrication step of the electrical devices.

5. In a metal lead frame as defined in claim 4, wherein the structure of each metal portion is such that the metal portion is severable adjacent each side of the free end projection and one of said severed parts has the locking apertures therein and the other said part has the free end projections therein.

6. In a product as defined in claim 4 wherein the mounting pads in such one piece lead frame are in one plane, and substantially the entire remaining metal of said lead frame is in another plane.

7. In a product as defined in claim 4 wherein the integral mounting pad in one section of a segment is laterally displaced relative to the mounting pad of the other section of such segment.

8. In a product as defined in claim 4 wherein one section of each segment has a plurality of mounting pads therein and the second section of such segment has a single mounting pad therein.

* * * * *